(12) United States Patent
Sakaue et al.

(10) Patent No.: US 7,281,472 B2
(45) Date of Patent: Oct. 16, 2007

(54) SCREEN PRINTING APPARATUS AND SCREEN PRINTING METHOD

(75) Inventors: Takaaki Sakaue, Fukuoka (JP); Yuji Otake, Fukuoka (JP); Masafumi Nishida, Fukuoka (JP); Tetsuya Tanaka, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 383 days.

(21) Appl. No.: 11/129,510

(22) Filed: May 13, 2005

(65) Prior Publication Data

US 2005/0252395 A1    Nov. 17, 2005

(30) Foreign Application Priority Data

May 17, 2004   (JP)   ............................. 2004-146285
May 17, 2004   (JP)   ............................. 2004-146286

(51) Int. Cl.
*B41M 1/12*   (2006.01)
(52) U.S. Cl. ....................... 101/129; 101/123; 101/126
(58) Field of Classification Search ................ 101/114, 101/123, 124, 126, 127, 127.1, 129; 118/406, 118/503
See application file for complete search history.

(56) References Cited

U.S. PATENT DOCUMENTS 5,176,078 A * 1/1993 Homma et al. ............. 101/126
5,452,655 A * 9/1995 Tani ........................... 101/123
5,623,872 A   4/1997 Tomomatsu
6,129,014 A   10/2000 Tani
6,868,780 B2 * 3/2005 Otake et al. ................ 101/129
7,225,732 B2 * 6/2007 Sakaue et al. ........... 101/127.1

FOREIGN PATENT DOCUMENTS

EP    0 374 073    6/1990
JP    7-214738     8/1995

\* cited by examiner

*Primary Examiner*—Ren Yan
(74) *Attorney, Agent, or Firm*—Pearne & Gordon LLP (57) ABSTRACT

In a screen printing apparatus for contacting a lower surface of a mask plate with a substrate and moving a squeezee in a sliding motion on an upper surface of the mask plate thereby printing a paste onto the substrate, mask bend preventing members are mounted on conveying rails at front and rear parts of clamp members clamping the substrate in a Y-direction, and, at a mask separating operation after printing, the substrate is lowered while the lower surface of the mask plate is supported by the clamp members and the mask bend preventing members. Thus the mask separation can be achieved in a state where the mask plate is supported from below on four sides of the substrate and is thus prevented from a downward bending, and a satisfactory mask separating property can be ensured over the entire substrate.

9 Claims, 11 Drawing Sheets

SCREEN PRINTING APPARATUS AND SCREEN PRINTING METHOD

BACKGROUND OF THE INVENTION

The present invention relates to a screen printing apparatus and a screen printing method for printing a paste such as cream solder onto a substrate.

For soldering an electronic component, there is known a method utilizing a solder bump or a solder precoating. In such method, a solder bump which is a protruding solder electrode or a solder precoat which is a solder film is formed for soldering, on an electrode of a work such as an electronic component or a substrate. In such solder forming step, a screen printing is widely employed as a method of solder supply. In such printing method, cream solder is printing on an upper surface of the work, through a hole pattern provided in a mask plate. In the screen printing operation, after a squeezing step of moving a squeezee, there is executing a mask separating step of separating the substrate from the lower surface of the mask plate. In such mask separating operation, the substrate is lowered by clamp members which clamp the substrate from both sides thereof at a printing position, in a state supporting the lower surface of the mask plate, whereby the substrate is separated from the mask plate (for example cf. Patent Literature 1).

Patent Literature 1:JP-A-7-214748

Recently, the electronic components are becoming finer to result in a smaller pitch of the electrodes formed on the work, whereby a large number of electrodes are arranged at a high density. Therefore, the mask plate employed for forming bumps on such electrodes have a thickness significantly smaller than that in a related mask plate employed for solder printing on a printed circuit board. However, such mask plate of a smaller thickness designed for the work having electrodes of such high density, in case applied to a related screen printing method, causes following drawbacks.

In order to attain a satisfactory printing quality in the screen printing, there are required a filling property of securely filling cream solder in the hole pattern and a satisfactory mask separating property, at a mask plate separation from the work after such filling, that the cream solder can be separated without a profile destruction from the pattern hole. However, the printing operation is becoming more difficult with the increasing density of the electrodes and the thinner mask and it is particularly difficult to ensure a satisfactory mask separating property over the entire area of the work.

SUMMARY OF THE INVENTION

Therefore, an object of the present invention is to provide a screen printing apparatus and a screen printing method capable of securing a satisfactory mask separating property.

In order to accomplish the above object, a screen printing apparatus and a screen printing method of the present invention are characterized by having the following arrangement.

(1) A screen printing apparatus for printing a paste through a hole pattern of a mask plate onto a substrate contacting with the mask plate comprising:

a positioning portion that supports the substrate in a state that the substrate is disposed between a lower surface of the mask plate and the positioning portion, conveys the substrate in a first direction so as to introduce the substrate for the printing, and discharge the substrate after the printing, conveys the substrate towards the mask plate so as to bring the substrate in contact with the lower surface of the mask plate for the printing, and separates the substrate from the lower surface of the mask plate after the printing;

a pair of clamp members that clamp the substrate in a second direction perpendicular to the first direction, and support the lower surface of the mask plate facing to outer sides of the substrate in the second direction when the substrate is separated from the lower surface of the mask plate; and a pair of mask bend preventing members that support the lower surface of the mask plate facing to outer sides of the substrate in the first direction when the substrate is separated from the lower surface of the mask plate.

(2) A screen printing apparatus according to (1), wherein the positioning portion supports the substrate in a manner sucking the substrate.

(3) A screen printing apparatus according to (1), wherein
the positioning portion includes two conveying rails provided in the first direction,
the pair of clamp members are coupled with the conveying rails and the pair of mask bend preventing members are coupled with the conveying rails, respectively, and
the conveying rails are moved so as to bring the pair of clamp members and the pair of mask bend preventing members in contact with the lower surface of the mask plate facing to the outer sides of the substrate.

(4) A screen printing apparatus according to (3), wherein the pair of mask bend preventing members are so mounted that height of upper surfaces of the pair of mask bend preventing members, contacting with the lower surface of the mask plate, matches that of upper surfaces of the pair of clamp members, contacting with the lower surface of the mask plate.

(5) A screen printing apparatus according to (1), wherein
the pair of mask bend preventing members are vertically movably provided integrally with the positioning portion, and
the apparatus further comprises a pair of maintaining members that maintain height of upper surfaces of the pair of mask bend preventing members same as that of the upper surfaces of the pair of clamp members when the substrate starts to be separated from the mask plate.

(6) A screen printing apparatus according to (5), wherein the pair of maintaining members maintain height of upper surfaces of the pair of mask bend preventing members same as that of upper surfaces of the pair of clamp members during the substrate is separated from the mask plate.

(7) A screen printing apparatus according to (5), wherein the pair of maintaining members urge the pair of mask bend preventing members towards the mask plate, and define an upper limit position of the pair of mask bend preventing members.

(8) A screen printing method comprising:
providing a mask plate that has a hole pattern;
introducing a substrate to a substrate supporting portion in a first direction so that the substrate is disposed between a lower surface of the mask plate and the substrate supporting portion;
clamping the substrate with a pair of clamp members in a second direction perpendicular to the first direction;
bringing the substrate, the clamp members and a pair of mask bend preventing members disposed at outer sides of the substrate in the first direction, in contact with the lower surface of the mask plate;

printing a paste on the substrate contacting with the mask plate through the hole pattern; and separating the substrate from the lower surface of the mask plate in a state where the lower surface of the mask plate is supported by the clamp members and the mask bend preventing members.

(9) A screen printing method according to (8), wherein, in the contacting step, upper surfaces of the substrate, the clamp members and the mask bend preventing members are contacted with the lower surface of the mask plate in a coplanar state.

According to the present invention, mask bend preventing members are so provided as to contact the lower surface of the mask plate in outer sides in a conveying direction of the substrate, thereby supporting the mask plate from the lower surface side thereof on four sides of the substrate in cooperation with the clamp members which clamp the substrate in a direction perpendicular to the conveying direction thereof, whereby the mask separation can be achieved in a state where the mask plate is prevented from a downward bending, and a satisfactory mask separating property can be ensured over the entire area of the substrate.

DETAIL DESCRIPTION OF PREFERRED EMBODIMENTS

Figure 1:
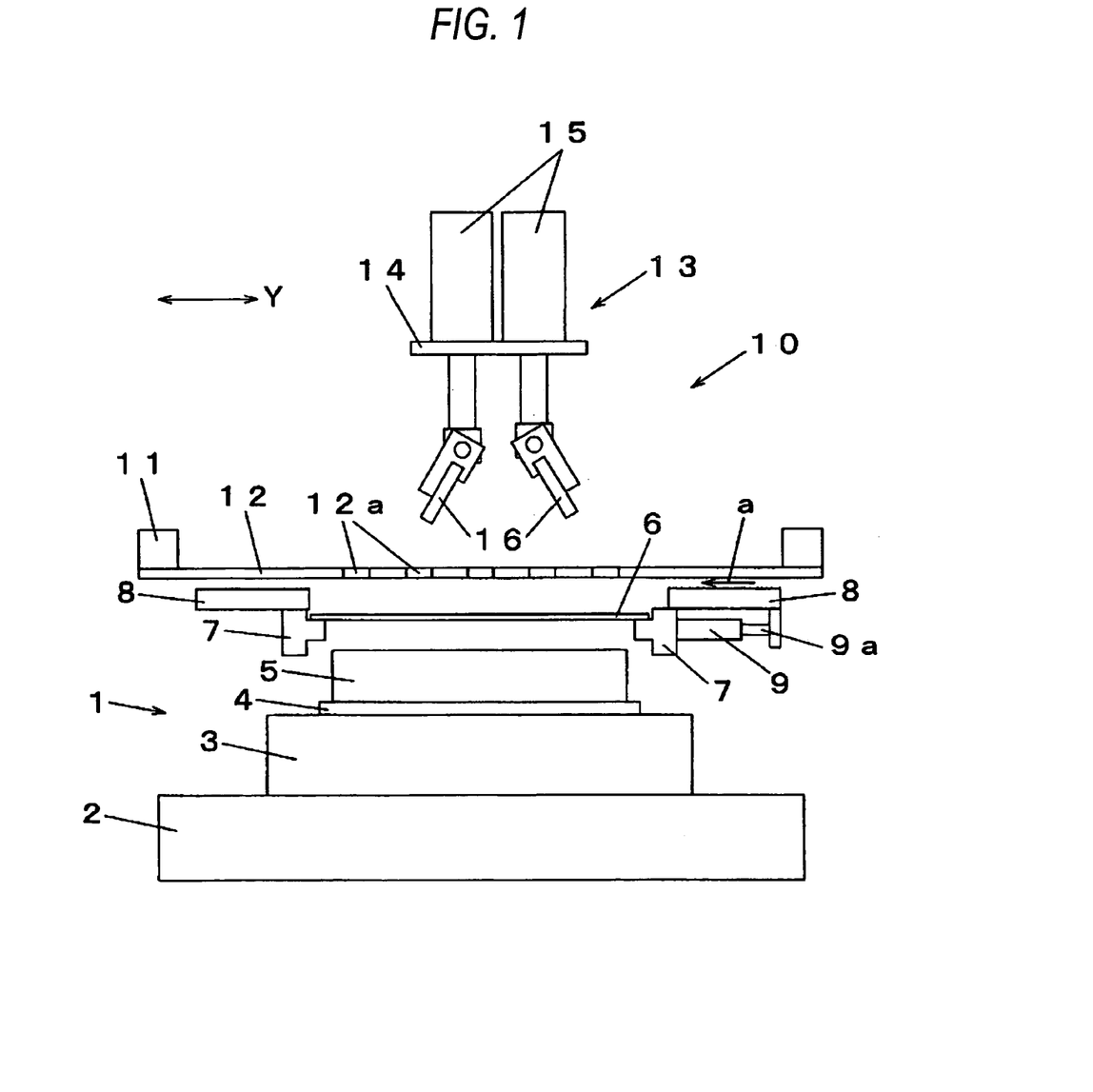
FIG. 1 shows a lateral view of a screen printing apparatus embodying the present invention.
Figure 2:
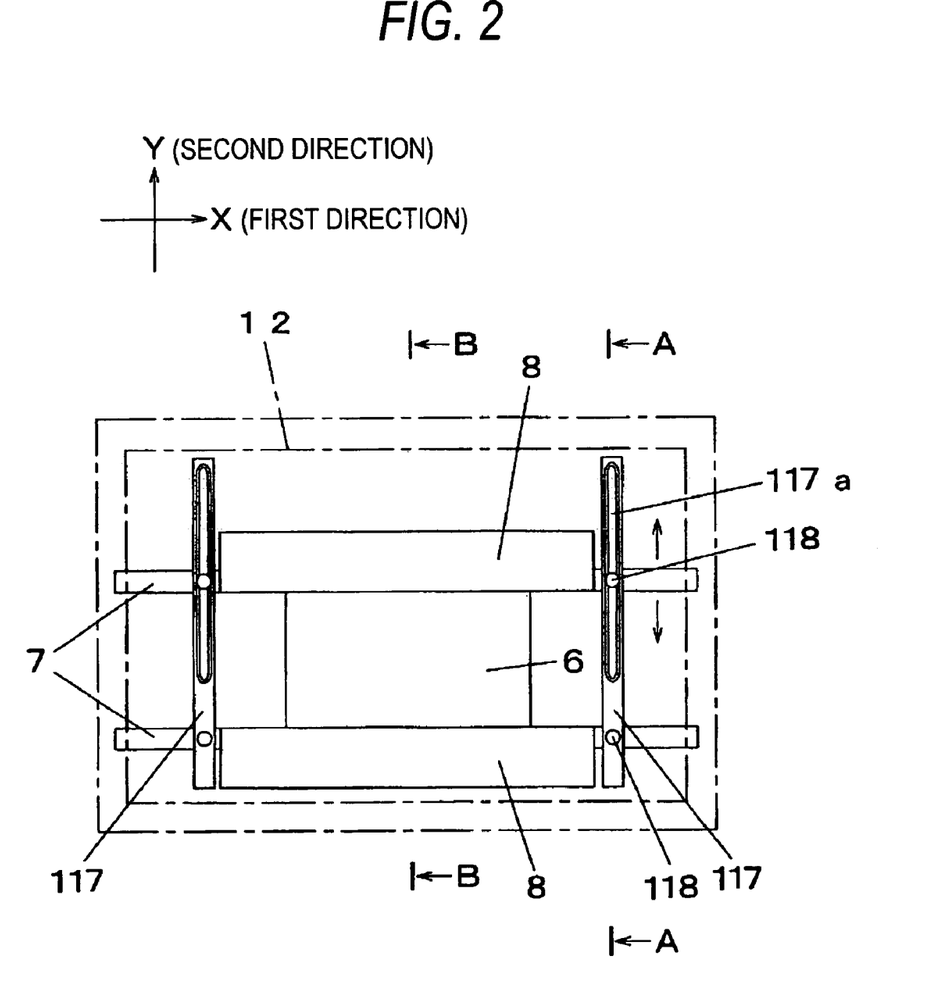
FIG. 2 shows a plan view of a screen printing apparatus embodying the present invention.
Figure 3A:
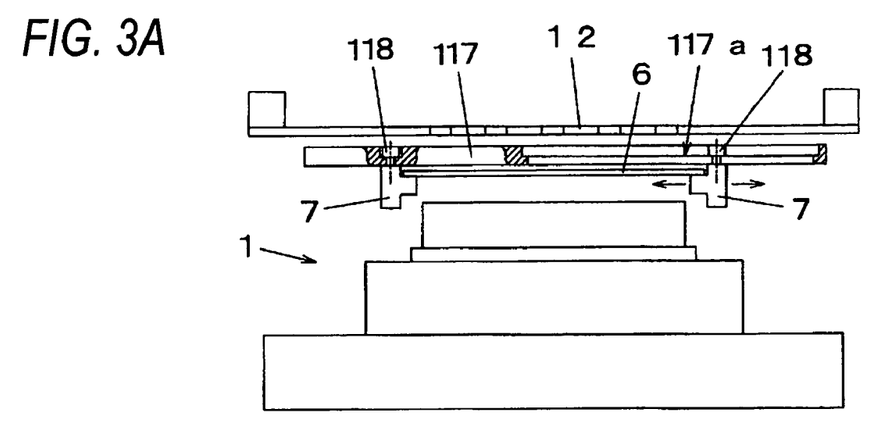
FIGS. 3A and 3B show partial cross-sectional views of a screen printing apparatus embodying the present invention.
Figure 3B:
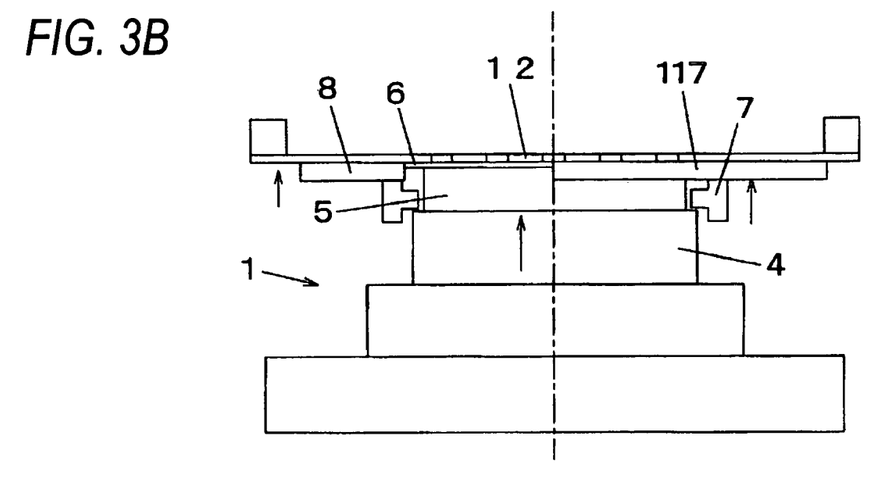
Figure 4:
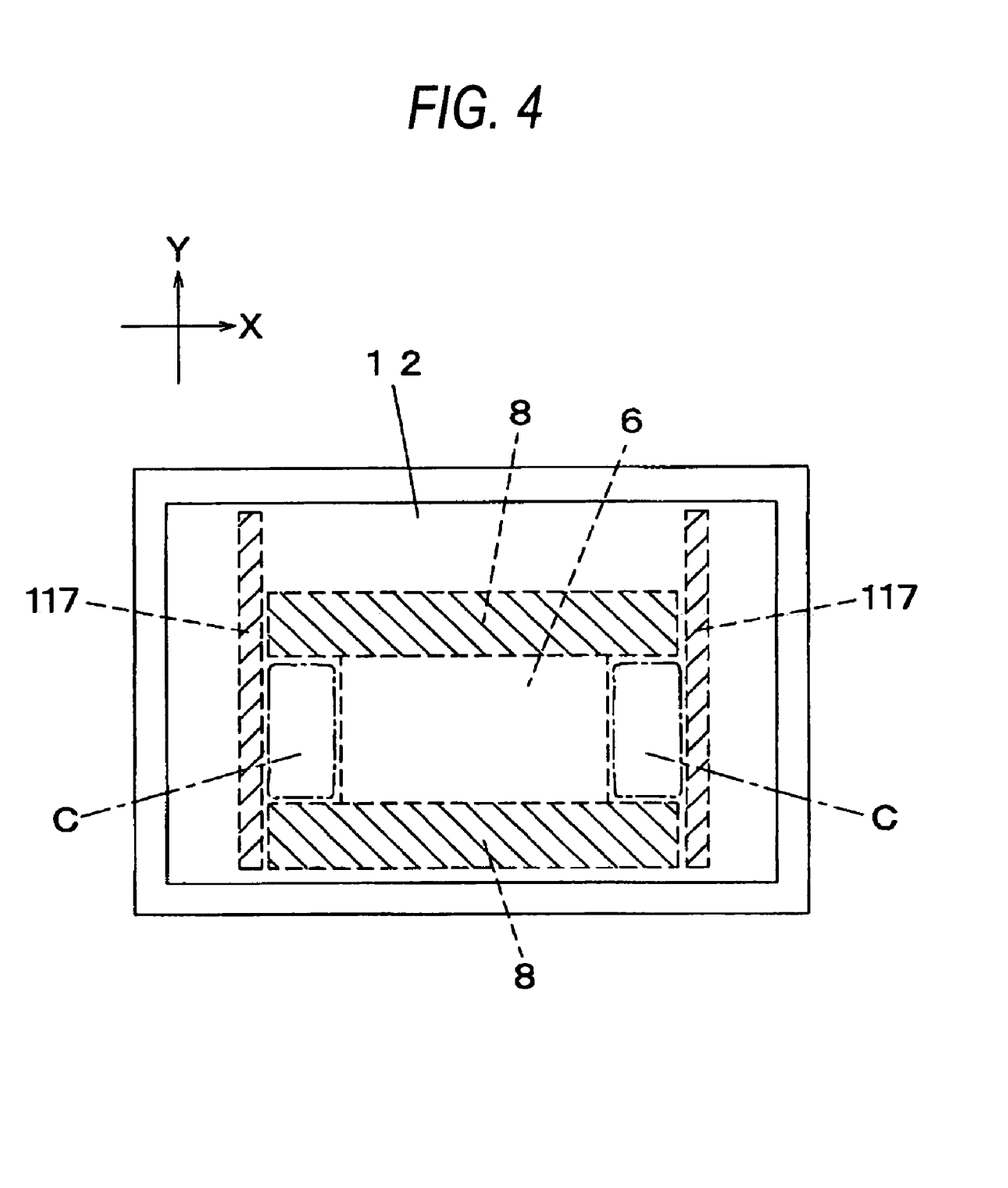
FIG. 4 shows a view showing a support state of a mask plate in a screen printing apparatus embodying the present invention.
Figure 7:
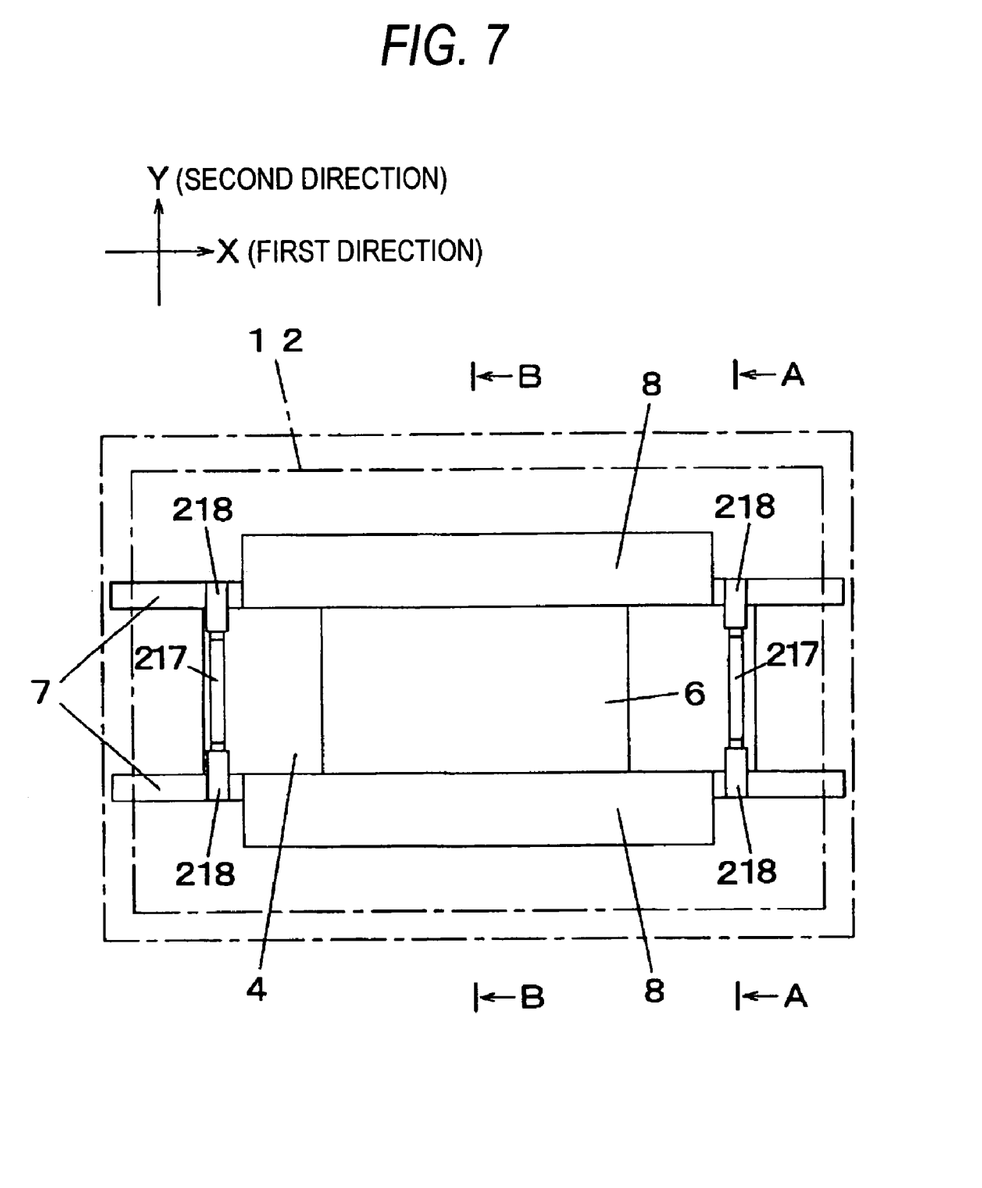
FIG. 7 shows a plan view of a screen printing apparatus embodying the present invention.
Figure 8A:
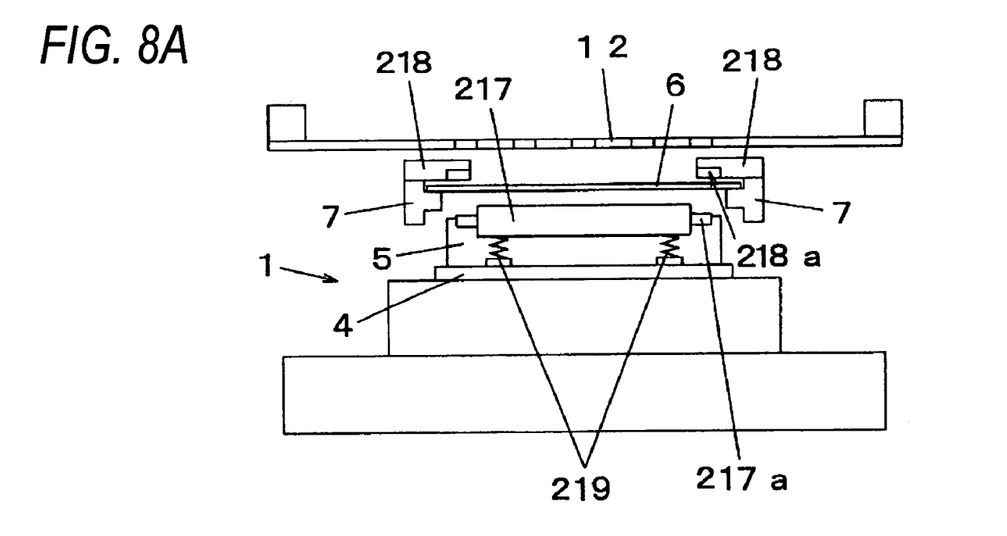
FIGS. 8A and 8B show partial cross-sectional views of a screen printing apparatus embodying the present invention.
Figure 8B:
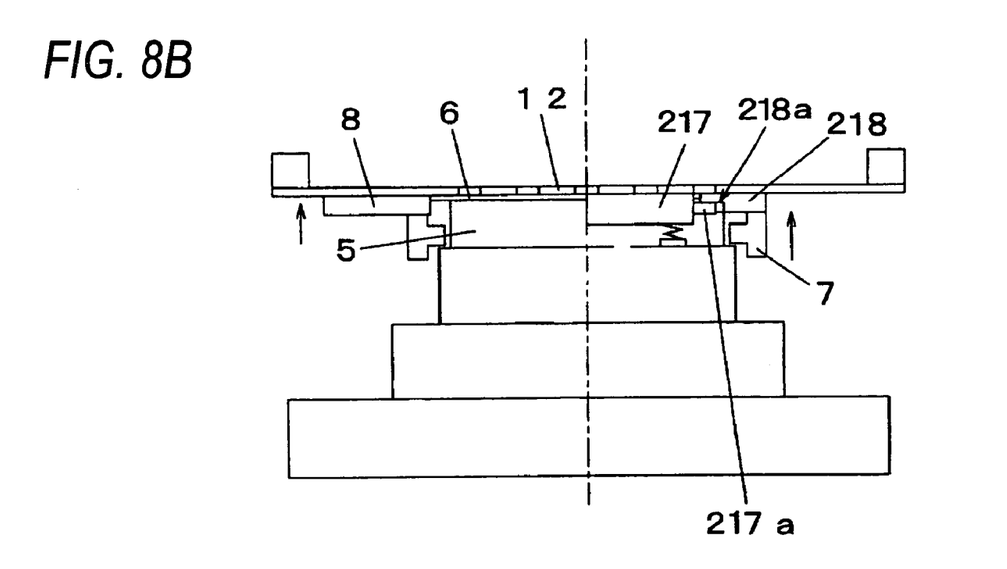
Figure 9:
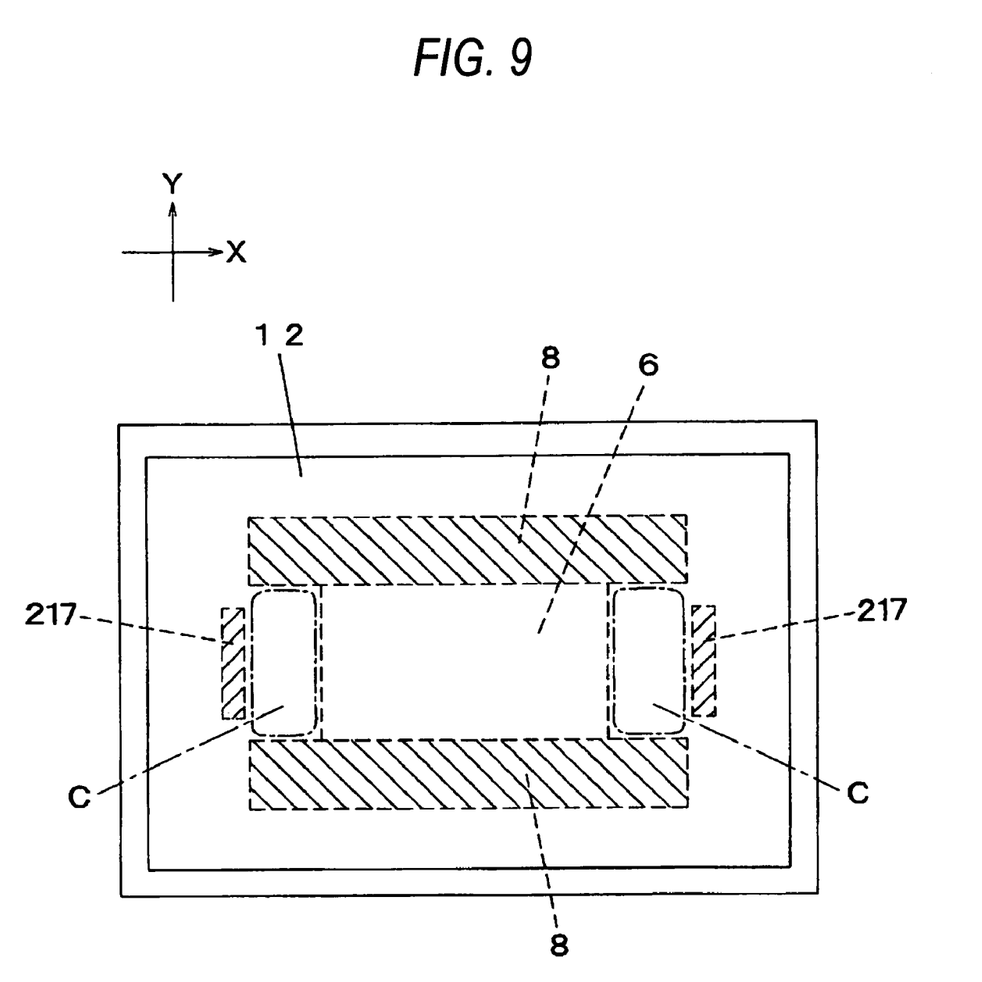
FIG. 9 show a view showing a support state of a mask plate in a screen printing apparatus embodying the present invention.

In the following, embodiments of the present invention will be explained with reference to accompanying drawings, in which FIG. 1 is a lateral view of a screen printing apparatus embodying the present invention; FIG. 2 is a plan view of a screen printing apparatus embodying the present invention; FIGS. 3A and 3B are partial cross-sectional views of a screen printing apparatus embodying the present invention; FIG. 4 is a view showing a mask plate supporting state in a screen printing apparatus embodying the present invention; FIGS. 5A, 5B, 5C, 6A, 6B and 6C are views showing functions of a screen printing apparatus embodying the present invention; FIG. 7 is a plan view of a screen printing apparatus embodying the present invention; FIGS. 8A and 8B are partial cross-sectional views of a screen printing apparatus embodying the present invention; FIG. 9 is a view showing a mask plate supporting state in a screen printing apparatus embodying the present invention; FIGS. 10A, 10B, 10C, 11A, 11B and 11C are views showing functions of a screen printing apparatus embodying the present invention.

Embodiment 1

At first a structure of a screen printing apparatus will be explained with reference to FIGS. 1 and 2. Referring to FIG. 1, a substrate positioning portion 1 is constituted by placing a substrate supporting portion 5 on a movable table formed by a Y-axis table 2, an X-axis table 3 and a Z-axis table 4. The substrate supporting portion 5 is provided on an upper surface thereof with a substrate supporting surface for sucking and supporting a substrate 6 and supports the substrate 6 from a lower surface thereof at a printing position at a lower surface of a mask plate in a screen printing portion to be explained later.

The Y-axis table 2 and the X-axis table 3 are driven in so controlled manner as to drive the substrate 6 supported by the substrate supporting portion 5 in X- and Y-directions thereby regulating the position of the substrate 6 at the screen printing. Also the Z-axis table 4 is driven in so controlled manner as to vertically move the substrate 6 supported by the substrate supporting portion 5 to an arbitrary position in height.

Above the substrate positioning portion 1, a pair of conveying rails 7 are provided in a horizontal direction for conveying the substrate 6, received from an upstream side, to the substrate positioning portion 1 in the X-direction (first direction). Also the substrate 6, after a printing in the substrate positioning portion 1 by a screen printing portion 10 to be explained later, is similarly conveyed by the conveying rails 7 toward a downstream side. Thus the conveying rails 7 constitute a substrate conveying portion for conveying the substrate 6 in the X-direction thereby introducing the substrate 6 into the substrate supporting portion 5 and discharging the substrate 6 from the substrate supporting portion 5 after printing.

The pair of conveying rails 7 are respectively provided with clamp members 8, one of which is coupled with a movable rod 9a of a clamp drive mechanism 9 and is movable horizontally. In a projecting state of the movable rod 9a, the clamp member 8 is in a position separated from a lateral edge of the substrate 6, namely in an unclamped state. By a returning motion of the movable rod 9a, the clamp member 8 of the movable side moves in the Y-direction (second direction) as indicated by an arrow a, whereby the substrate 6 supported by the substrate supporting portion 5 is pinched on end faces at lateral edges thereof from both sides and is thus clamped. The conveying rails 7 are movable vertically by a conveying portion elevator mechanism (not shown), thus being capable of bringing, at the printing operation, the substrate 6 clamped by the clamp members 8 in contact with a lower surface of a mask plate 12.

A screen printing portion 10 is provided above the substrate positioning portion 1 and is constituted of a mask plate 12, extended on a rectangular holder 11 and having a plurality of hole patterns 12a, and a squeezee unit 13 provided thereabove. The squeezee unit 13 is provided with squeezees 16 vertically movably by two squeezee elevating mechanisms 15 which are vertically provided on a horizontal base 14, and executes a reciprocating motion in the Y-direction by an unillustrated squeezee moving mechanism.

The substrate 6 is aligned by the substrate positioning portion 1 with respect to the mask plate 12, and is maintained in contact with the lower surface of the mask plate 12. In a state where the substrate 6 is maintained in contact with the lower surface of the mask plate 12, a cream solder paste is supplied onto the mask plate 12 and the squeezee 16 is made to slide in contact with an upper surface of the mask plate 12 thereby printing the cream solder on the substrate 6 through the hole patterns 12a. In such screen printing operation, the substrate 6 is clamped on both sides by the clamp members 8 and is thus maintained in a horizontal position.

On the conveying rails 7, as shown in FIG. 2, two mask bend preventing members 117 that have an elongated plate-shape are mounted respectively corresponding to the front and rear ends of the clamp member 8, with height of upper surfaces of the mask bend preventing members 117 matching that of upper surfaces of the clamp members 8. The mask bend preventing members 117 are positioned above the upper surface of the conveying rails 7 in order not to hinder the conveying operation for the substrate 6 by the conveying rails 7. Thus the clamp members 8 and the mask bend preventing members 117 are coupled with the conveying rails 7 provided in the X-direction in the substrate conveying portion 5.

The mask bend preventing member 117 is provided with a vertically penetrating elongated groove 117a over a substantially half of a total length thereof, in order that the conveying rail 7 of a movable side (right-hand side in FIG. 1) can be changes in the position in a direction of width. In FIG. 3A illustrates a cross section along a line A-A in FIG. 2, wherein the mask bend preventing member 117 is fixed to the conveying rail 7 of a fixed side (left-hand side in FIG. 1) by means of a bolt 118, while it is held by the conveying rail 7 of the movable side by passing a bolt 118 through the elongated groove 117a thereby restricting a movement in the vertical direction of the conveying rail 7. The bolt 118 is made to slide along the elongated groove 117a in case the conveying rail 7 of the movable side is displaced in the Y-direction according to a width dimension of the substrate 6.

In FIG. 3B indicates positions of the clamp members 8 and the mask bend preventing members 117 in the direction of height, when a printing operation is executed by the screen printing portion 10 on the substrate 6 supported by the substrate supporting portion 5. In such printing operation, the substrate supporting portion 5 supporting the substrate 6 is elevated by the Z-axis table 4 and the conveying rails 7 are elevated by the conveying portion elevator mechanism whereby the clamp members 8 and the mask bend preventing members 117 are brought in contact with the lower surface of the mask plate 12.

Thus, as illustrated in FIG. 4, the mask plate 12 is supported, in a peripheral area of the substrate 6 contacted on the lower surface thereof, from below in outer positions by the clamp members 8 on two sides along the X-direction and by the mask bend preventing members 117 on two side along the Y-direction. The printing operation by the screen printing portion 10 is executed in such supported state. Also a mask separating operation of separating the substrate 6 from the lower surface of the mask plate 12 after the printing operation is executed by lowering the substrate supporting portion 5 by the Z-axis table 4 in the supported state of the mask plate 12 as shown in FIG. 4.

Thus, in the aforementioned configuration, the Z-axis table 4 has a mask separation function which separates the substrate 6, supported by the substrate supporting portion 5 and maintained in contact with the lower surface of the mask plate 12, from the lower surface of the mask plate 12. Also the clamp members 8 clamp the substrate 6, supported by the substrate supporting portion 5, in the Y-direction perpendicular to the X-direction, and support the lower surface of the mask plate in outer sides of the substrate 6 in the Y-direction, at the mask separating operation for separating the substrate 6 from the lower surface of the mask plate 12. Also the mask bend preventing members 117 are provided at positions not hindering the conveying of the substrate 6 in the substrate supporting portion 5, and support the lower surface of the mask plate in outer sides of the substrate 6 in the Y-direction, at the mask separating operation.

Referring to FIG. 4, in case the substrate 6 has a size smaller than a length of the clamp members 8 in the X-direction, there is generated, between the mask bend preventing member 117 and the substrate 6, a non-supported area (chain-lined area) C where the mask plate 12 is not supported from below. In such case, such non-supported area can be minimized for example by preparing the mask bend preventing member 117 with such a planar shape as to cover the non-supported area C (for example a shape having a protruding portion toward the substrate) according to the size of the substrate 6 and to exchange the member 117 according to the substrate 6.

Figure 5A:
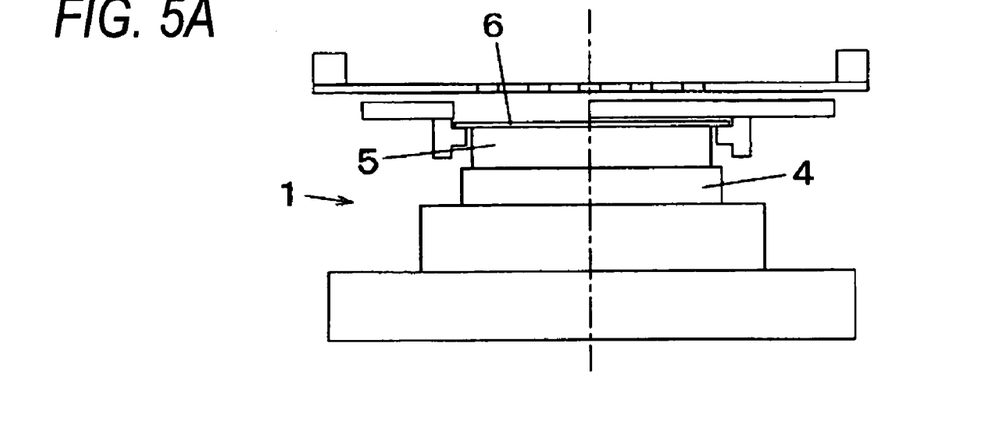
FIGS. 5A, 5B and 5C show views showing functions of a screen printing apparatus embodying the present invention.

In the following there will be explained a screen printing operation by the aforementioned screen printing apparatus, with reference to FIGS. 5A, 5B, 5C, 6A, 6B and 6C. In FIGS. 5A, 5B, 5C, 6A, 6B and 6C, a left-hand portion of a center line indicates a state of components in a B-B cross section in FIG. 2, and a right-hand portion indicates a state of components in an A-A cross section in FIG. 2. At first, as shown in FIG. 5A, a substrate 6 to be printed is conveyed in the first direction by the conveying rails 7 and is introduced into the substrate supporting portion 5 of the substrate positioning portion 1 (substrate introducing step), and then the substrate supporting portion 5 is elevated by the Z-axis table 4 to contact the lower surface of the substrate 6 thereby supporting the same from below.

Figure 5B:
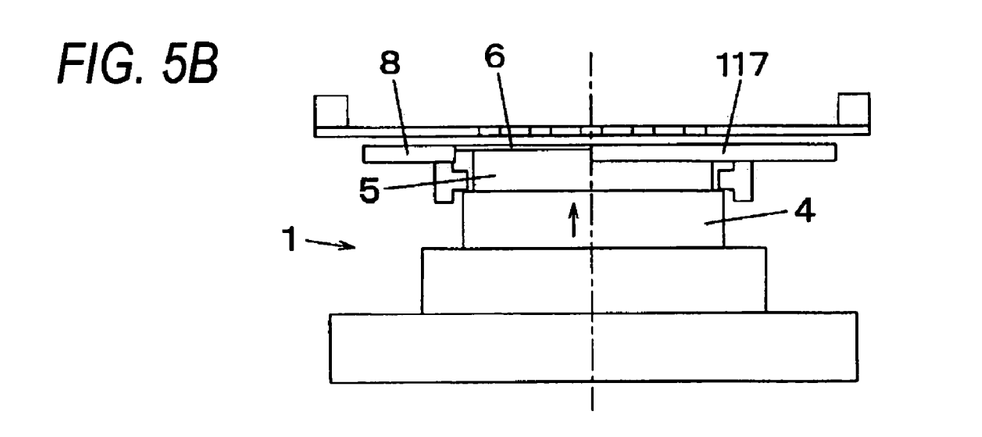
Figure 5C:
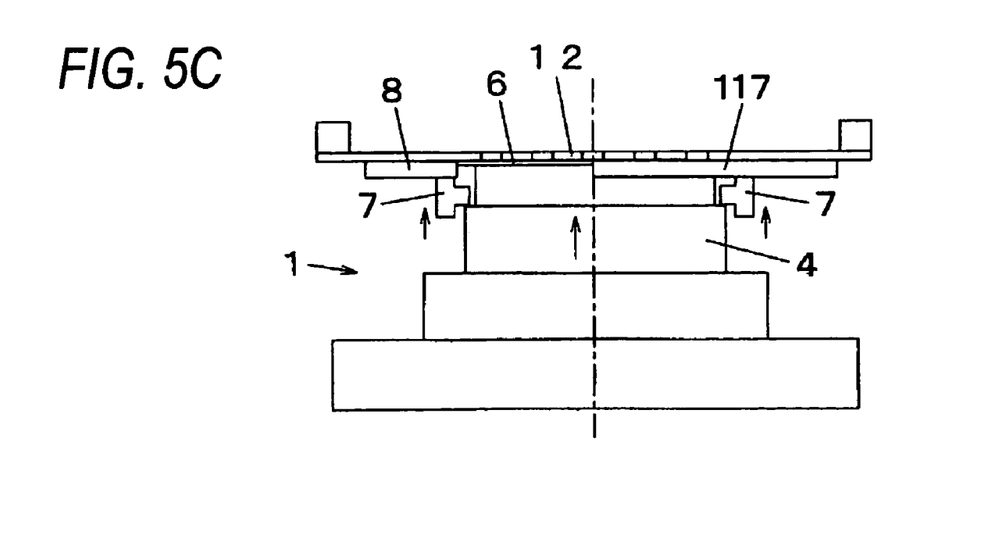

Thereafter, as shown in FIG. 5B, the substrate supporting portion 5 is further elevated by the Z-axis table to match the upper surface of the substrate 6 coplanar with the upper surface of the clamp members 8 and the mask bend preventing members 117, and both end faces of the substrate 6 are clamped by the clamp members 8 in the Y-direction (clamping step). Then, as shown in FIG. 5C, the conveying rails 7 are elevated by the conveying portion elevator mechanism to contact the lower surface of the mask plate 12 in relative manner with the substrate 6, the clamp members 8 and the mask bend preventing members 117 provided in outer sides of the substrate 6 in the X-direction (mask mounting step). Thus the mask plate 12 is supported from below in an arrangement in a plan view shown in FIG. 4.

Figure 6A:
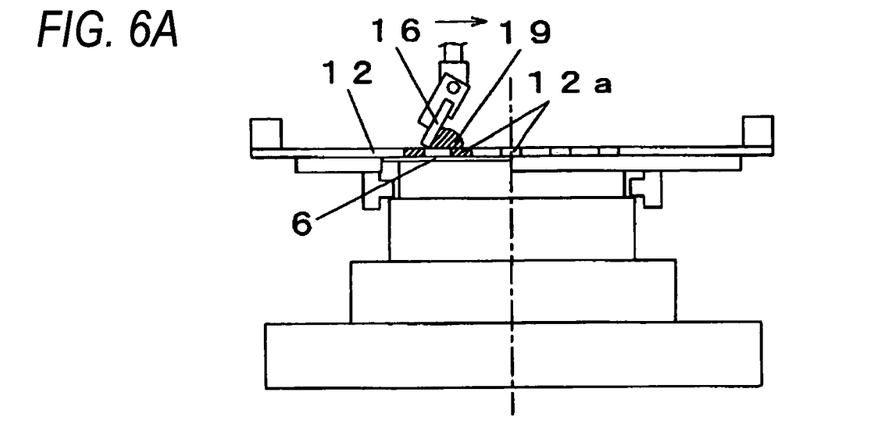
FIGS. 6A, 6B and 6C show views showing functions of a screen printing apparatus embodying the present invention.
Figure 6B:
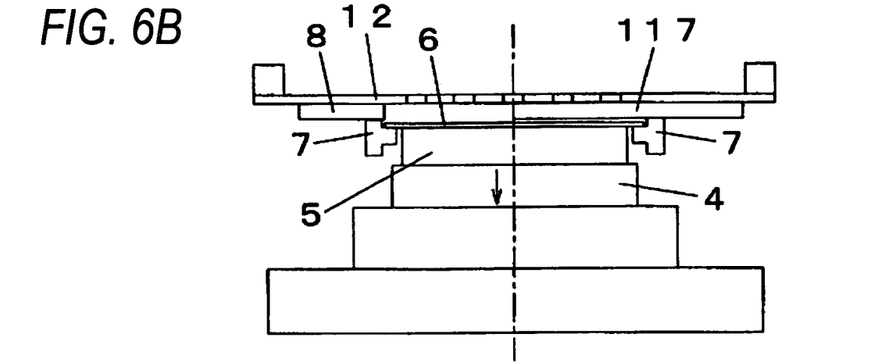

In this state, the squeezee 16 is made to slide on the upper surface of the mask plate 12 as shown in FIG. 6A to print the cream solder 19 onto the substrate 6 through the hole pattern 12a (squeezing step). Then the mask separation is executed. As shown in FIG. 6B, the substrate supporting portion 5 is lowered by the Z-axis table 4 in a state where the lower surface of the mask plate 12 is supported by the clamp members 8 and the mask bend preventing members 117 thereby separating the substrate 6, supported by suck on the upper surface of the substrate supporting portion 5, from the lower surface of the mask plate 12 (mask separation step), and the substrate 6 is placed on the conveying rails 7.

Figure 6C:
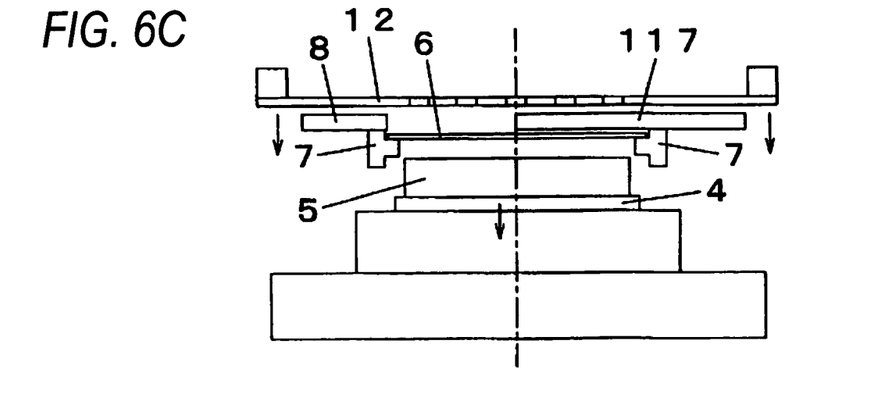

Thereafter, the conveying rails 7 are lowered as shown in FIG. 6C to separate the clamp members 8 and the mask bend preventing members 117 from the lower surface of the mask plate 12, and the substrate 6 after the printing operation is conveyed to the downstream side by the conveying rails 7, whereby serial screen printing operations on a substrate 6 are terminated.

In the aforementioned screen printing operations, since the mask separation is executed in a supporting state of the mask plate 12, in which coplanar upper surfaces of the clamping members 8 and the mask bend preventing members 117 supports the lower surface of the mask plate 12 in outer positions of four sides of the substrate 6, as shown in FIG. 4, there can be avoided drawbacks resulting from so-called "mask adhesion" which tends to appear when the substrate 6 is lowered, from a state where it is contacted with the lower surface of the mask plate 12, to separate the upper surface of the substrate 6 and the lower surface of the mask plate 12.

More specifically, generally in a state after a squeezing, the upper surface of the substrate and the lower surface of the mask plate are in a mutually adhered state not only by the cream solder in the hole pattern but also by the cream solder oozing out between the upper surface of the substrate and the lower surface of the mask plate, so that, at the start of the mask separating operation, the mask plate tends to be bent downwards by being pulled by the substrate. Then, when a bend amount of the mask plate reaches a certain limit and a returning force for returning such bend to the original state overcomes the adhering force between the mask plate and the substrate, the upper surface of the substrate is separated from the lower surface of the mask plate.

In case such bend amount is large, a state of extraction of the cream solder from the pattern hole does not become uniform over the entire area of the mask plate, and a print defect such as a print profile destruction tends to be generated such as cream solder remaining in the pattern hole or cream solder extracted in an irregular shape. It is therefore desirable, for the purpose of minimizing the bending of the mask plate at the mask separation, to support the lower surface of the mask plate 12 in a position as close as possible to the outer edge of the substrate 6.

In the present embodiment, the mask plate 12 is supported on the lower surface thereof in the outer positions of four sides of the substrate 6 as explained above, namely by the clamp members 8 on two sides along the X-direction and by the mask bend preventing members 117 on two sides along the Y-direction, thereby minimizing the bend of the mask plate 12 at the mask separation. In this manner, uniform and satisfactory mask separating property can be secured over the entire substrate even in case of a substrate bearing fine-pitch electrodes at a high density.

Embodiment 2

In the present embodiment, a structure of the screen printing apparatus is same as that in the embodiment 1 and will not, therefore, be explained.

On the upper surface of the Z-axis table 4, as shown in FIG. 7, two mask bend preventing members 217 have a prolonged plate shape, and are provided in the Y-direction, respectively positioned at the front and rear ends of the clamp members 8 that is provided in the X-direction. Above both ends of the mask bend preventing member 217, high limiting members 218 fixed to the two conveying rails 7 are extended in the Y-direction. In FIG. 8A shows a cross section along a line A-A in FIG. 7, in which the mask bend preventing members 217 are vertically movably provided on the upper surface of the Z-axis table 4, integrally with the substrate supporting portion 5.

The mask bend preventing members 217 are urged upwards by compression springs 219, and are extendable and contractable by a compression margin of the compression springs 219. Also above stoppers 217a extended outwards from both end faces of the mask bend preventing member 217, there are provided height limiting faces 218a formed by partially notching lower faces of the height limiting members 218. By an elevation of the Z-axis table 4, the mask bend preventing members 217 are elevated and the stoppers 217a abut against the height limiting faces 218a.

The dimensions of the mask bend preventing members 217 and the height limiting members 218 are so selected that, in such abutting state, the upper surfaces of the mask bend preventing members 217 reach a state coplanar with the upper surfaces of the clamp members 8. Since the mask bend preventing members 217 are urged upwards by the compression springs 219, after the stoppers 217a abut against the height limiting faces 218a once, the height of the mask bend preventing members 217 is maintained at a predetermined height regardless of the position in height of the Z-axis table 4.

FIG. 8B shows the positions in height of the clamp members 8 and the mask bend preventing member 217 when a printing operation is executed by the screen printing portion 10 on the substrate 6 supported by the substrate supporting portion 5. In such printing operation, the conveying rails 7 are elevated together with the clamp members 8 by the conveying portion elevator mechanism, whereby the clamp members 8 are in contact with the mask plate 12. Also the substrate supporting portion 5 supporting the substrate 6 and the mask bend preventing members 217 are elevated by the Z-axis table 4 and, as the height of the stoppers 217a is limited by the height limiting faces 218a, the mask bend preventing member 217 becomes coplanar with the upper surface of the clamp members 8 and is similarly contacted with the lower surface of the mask plate 12.

Thus, as shown in FIG. 9, the mask plate 12 is supported on the lower surface thereof around the substrate 6, by the clamp members 8 on two sides along the X-direction and by the mask bend preventing members 217 on two sides along the Y-direction. The printing operation by the screen printing portion 10 is executed in such a support state.

Also the mask separating operation of separating the substrate 6 from the lower surface of the mask plate 12 after the printing operation is executed by lowering the substrate supporting portion 5 by the Z-axis table 4 in the support state of the mask plate 12 shown in FIG. 9. At the start of such mask separating operation, while the Z-axis table 4 is lowered by a compressed height of the compression springs 219, the stoppers 217a remain in the abutting state against the height limiting faces 218a by the urging force of the compression springs 219. Thus, in the initial period of the mask separating operation when the substrate 6 starts to be separated from the mask plate 12, the upper surface of the mask bend preventing member 217 is maintained in a state coplanar with the height of the upper surface of the clamp members 8, thereby supporting the lower surface of the mask plate 12 from below.

Thus, in the aforementioned configuration, the Z-axis table 4 has a mask separation function which separates the substrate 6, supported by the substrate supporting portion 5 and maintained in contact with the lower surface of the mask plate 12, from the lower surface of the mask plate 12. Also the clamp members 8 clamp the substrate 6, supported by the substrate supporting portion 5, in the Y-direction perpendicular to the X-direction, and support the lower surface of the mask plate 12 in outer sides of the substrate 6 in the Y-direction, at the mask separating operation for separating the substrate 6 from the lower surface of the mask plate 12.

Also the mask bend preventing members 217 are provided vertically movably by the Z-axis table 4, integrally with the substrate supporting portion 5, and support the lower surface of the mask plate 12 in outer sides of the substrate 6 in the X-direction, at the printing operation. The compression springs 219 constitute urging means which urges the mask bend preventing members 217 upwardly, and the height limiting faces 218*a* constitute height limiting means which limits the upper limit positions for the mask bend preventing members 217. Further, the compression springs 219 and the height limiting faces 218*a* constitute, in the mask separating operation, member height maintaining means which maintains the upper surface of the mask bend preventing members 217 at a same height as the upper surface of the clamp members 8, at least in an initial stage of the mask separation when the substrate 6 starts to be separated from the mask plate 12.

Referring to FIG. 9, in case the substrate 6 has a size smaller than a length of the clamp members 8 in the X-direction, there is generated, between the mask bend preventing member 117 and the substrate 6, a non-supported area (chain-lined area) C where the mask plate 12 is not supported from below. In such case, such non-supported area can be minimized for example by preparing the mask bend preventing member 117 with such a planar shape as to cover the non-supported area C (for example a shape having a protruding portion toward the substrate) according to the size of the substrate 6 and to exchange the member 117 according to the substrate 6.

Also in case the substrate 6 has a substantially constant size in the X-direction, it is desirable to position the mask bend preventing member 217 in the area C thereby minimizing the gap to the substrate 6. In such case, a height limiting face is provided in the clamp member 8 instead of the height limiting member 218 fixed to the conveying rails 7.

Figure 10A:
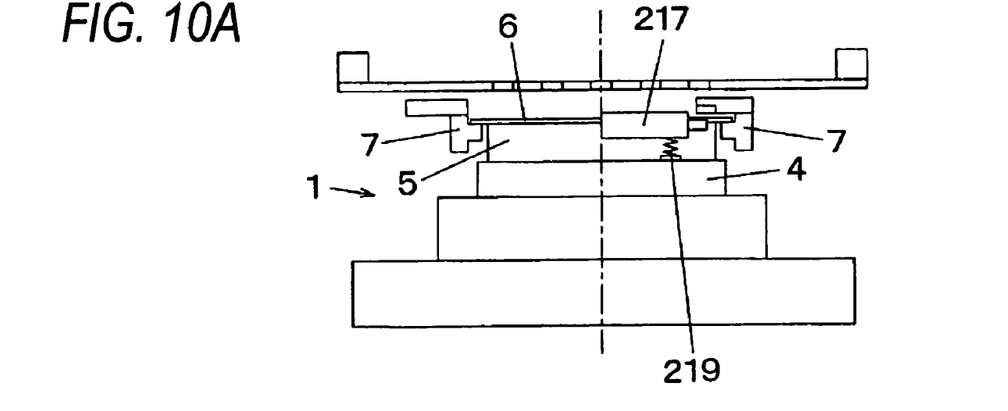
FIGS. 10A, 10B and 10C show views showing functions of a screen printing apparatus embodying the present invention.

In the following there will be explained a screen printing operation by the aforementioned screen printing apparatus, with reference to FIGS. 10A, 10B, 10C, 11A, 11B and 11C. In FIGS. 10A, 10B, 10C, 11A, 11B and 1C, a left-hand portion of a center line indicates a state of components in a B-B cross section in FIG. 7, and a right-hand portion indicates a state of components in an A-A cross section in FIG. 7. At first, as shown in FIG. 10A, a substrate 6 to be printed is conveyed in the first direction by the conveying rails 7 and is introduced into the substrate supporting portion 5 of the substrate positioning portion 1 (substrate introducing step), and then the substrate supporting portion 5 is elevated by the Z-axis table 4 to contact the lower surface of the substrate 6 thereby supporting the same from below. In this state, the mask bend preventing members 217 are not restricted from above but are extended upwards by the compression springs 219.

Figure 10B:
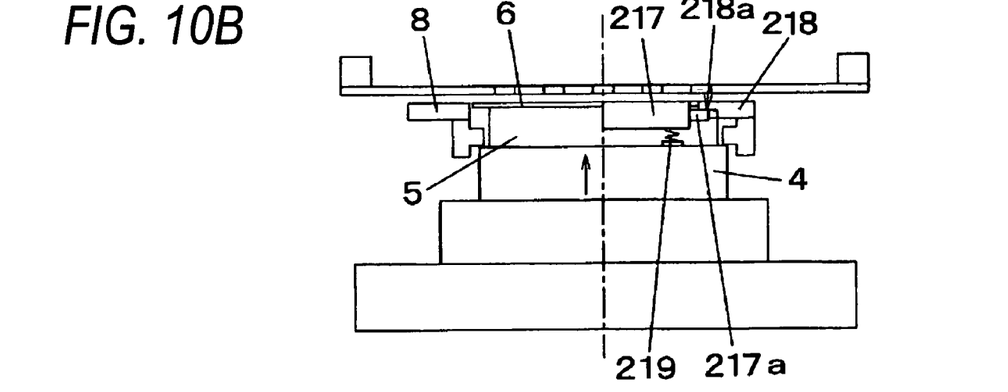

Thereafter, as shown in FIG. 10B, the substrate supporting portion 5 is further elevated by the Z-axis table to match the upper surface of the substrate 6 coplanar with the upper surface of the clamp members 8, and both end faces of the substrate 6 are clamped by the clamp members 8 in the Y-direction (clamping step). In this state, also the mask bend preventing members 217 are elevated until the stoppers 217*a* abut against the height limiting faces 218*a*, whereby the upper surface of the mask bend preventing members 217 also become coplanar with the upper surface of the clamp members 8.

Figure 10C:
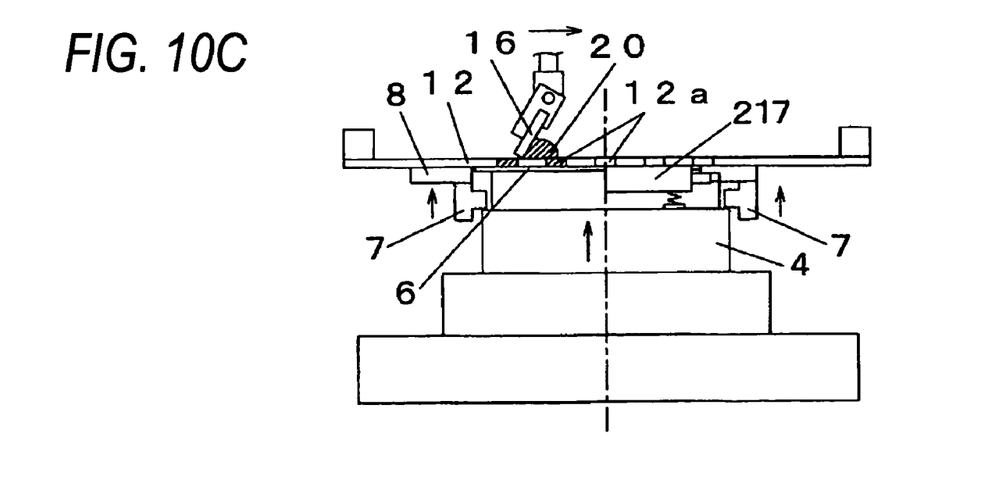

Then, as shown in FIG. 10C, the conveying rails 7 are elevated by the conveying portion elevator mechanism to contact the lower surface of the mask plate 12 in relative manner with the mask bend preventing members 217 provided in outer sides of the substrate 6 in the X-direction, the clamp members 8 and the substrate 6 (mask mounting step). Thus the mask plate 12 is supported from below in an arrangement in a plan view shown in FIG. 9. In this state, the squeezee 16 is made to slide on the upper surface of the mask plate 12 to print the cream solder 20 onto the substrate 6 through the hole pattern 12*a* (squeezing step).

Figure 11A:
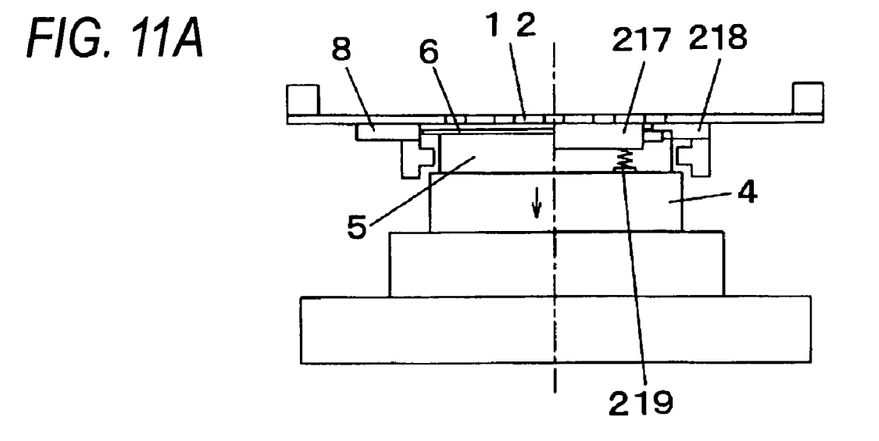
FIGS. 11A, 11B and 11C show views showing functions of a screen printing apparatus embodying the present invention.

Then the mask separation is executed. As shown in FIG. 11A, the substrate supporting portion 5 is lowered by the Z-axis table 4 to separate the substrate 6, supported by suck on the upper surface of the substrate supporting portion 5, from the lower surface of the mask plate 12 (mask separation step). In this operation, the clamp members 8 remain in contact with the lower surface of the mask plate 12, and the mask bend preventing members 217 remain, until the Z-axis table 4 is lowered beyond the compression amount of the compression springs 219, a state where the stoppers 217*a* abut against the height limiting faces 218*a* by the upward urging of the compression springs 219, whereby the upper surface of the mask bend preventing members 217 remains in contact with the lower surface of the mask plate 12 and maintains a state supported from the under side.

Figure 11B:
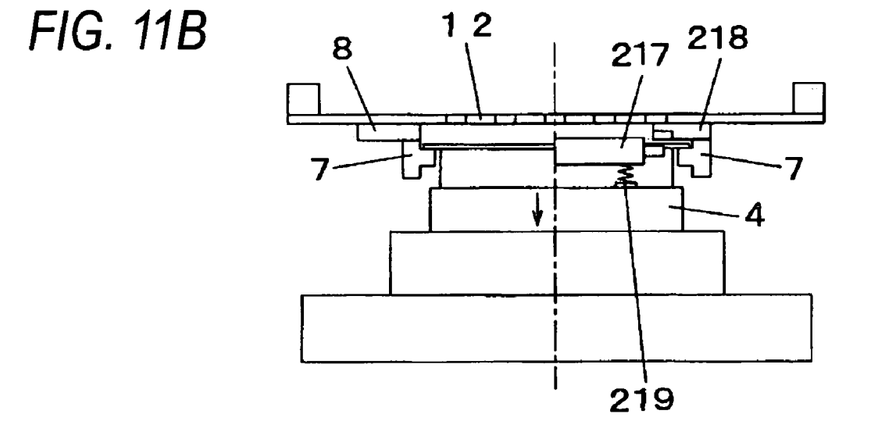
Figure 11C:
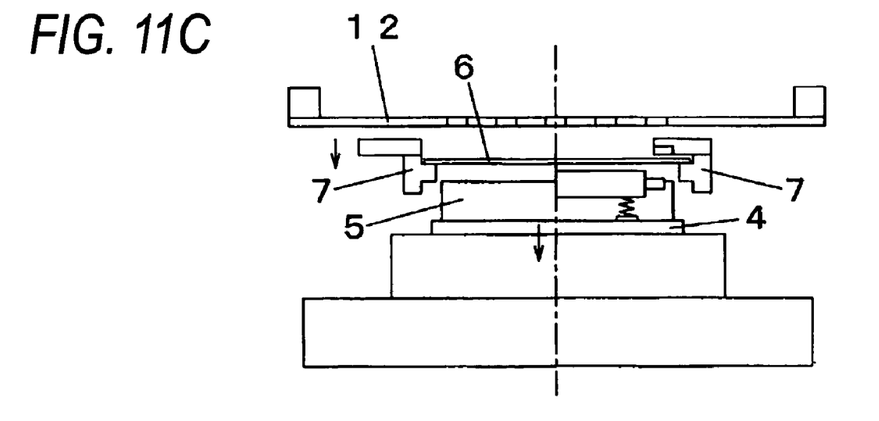

Then, by a further lowering of the Z-axis table 4, the substrate 6 supported by the substrate supporting portion 5 lowers and is placed on the conveying rails 7 as shown in FIG. 11B. At the same time, as the Z-axis table 4 lowers beyond the compressed amount of the compression springs 219, the mask bend preventing members 217 are separated from the lower surface of the mask plate 12. Thereafter, the conveying rails 7 are lowered as shown in FIG. 11C to separate the clamp members 8 from the lower surface of the mask plate 12, and the substrate 6 after the printing operations is conveyed to the downstream side by the conveying rails 7, whereby serial screen printing operations on a substrate 6 are terminated.

In the aforementioned screen printing operations, since the mask separation is executed in a supporting state of the mask plate 12 as shown in FIG. 9, there can be avoided drawbacks resulting from so-called "mask adhesion" which tends to appear when the substrate 6 is lowered, from a state where it is contacted with the lower surface of the mask plate 12, to separate the upper surface of the substrate 6 and the lower surface of the mask plate 12.

More specifically, generally in a state after a squeezing, the upper surface of the substrate and the lower surface of the mask plate are in a mutually adhered state not only by the cream solder in the hole pattern but also by the cream solder oozing out between the upper surface of the substrate and the lower surface of the mask plate, so that, at the start of the mask separating operation, the mask plate tends to be bent downwards by being pulled by the substrate. Then, when a bend amount of the mask plate reaches a certain limit and a returning force for returning such bend to the original state overcomes the adhering force between the mask plate and the substrate, the upper surface of the substrate is separated from the lower surface of the mask plate.

In case such bend amount is large, a state of extraction of the cream solder from the pattern hole does not become uniform over the entire area of the mask plate, and a print defect such as a print profile destruction tends to be generated such as cream solder remaining in the pattern hole or cream solder extracted in an irregular shape. It is therefore desirable, for the purpose of minimizing the bending of the mask plate at the mask separation, to support the lower surface of the mask plate 12 in a position as close as possible to the outer edge of the substrate 6.

In the present embodiment, the mask plate 12 is supported on the lower surface thereof in the outer positions of four sides of the substrate 6 as explained above, namely by the clamp members 8 on two sides along the X-direction and by the mask bend preventing members 217 on two sides along the Y-direction, thereby minimizing the bend of the mask plate 12 at the mask separation. In this manner, uniform and satisfactory mask separating property can be secured over the entire substrate even in case of a substrate bearing fine-pitch electrodes at a high density.

The screen printing apparatus and the screen printing method of the present invention have an effect of securing a satisfactory mask separating property, and are useful in fields of printing a paste such as a cream solder or an conductive paste on a substrate.

What is claimed is:

1. A screen printing method comprising:
   providing a mask plate that has a hole pattern;
   introducing a substrate to a substrate supporting portion in a first direction so that the substrate is disposed between a lower surface of the mask plate and the substrate supporting portion;
   clamping the substrate with a pair of clamp members in a second direction perpendicular to the first direction;
   bringing the substrate, the clamp members and a pair of mask bend preventing members disposed at outer sides of the substrate in the first direction, in contact with the lower surface of the mask plate;
   printing a paste on the substrate contacting with the mask plate through the hole pattern; and
   separating the substrate from the lower surface of the mask plate in a state where the lower surface of the mask plate is supported by the clamp members and the mask bend preventing members.

2. A screen printing method according to claim 1, wherein, in the contacting step, upper surfaces of the substrate, the clamp members and the mask bend preventing members are contacted with the lower surface of the mask plate in a coplanar state.

3. A screen printing apparatus for printing a paste through a hole pattern of a mask plate onto a substrate contacting with the mask plate comprising:
   a positioning portion that supports the substrate in a state that the substrate is disposed between a lower surface of the mask plate and the positioning portion, conveys the substrate in a first direction so as to introduce the substrate for the printing, and discharge the substrate after the printing, conveys the substrate towards the mask plate so as to bring the substrate in contact with the lower surface of the mask plate for the printing, and separates the substrate from the lower surface of the mask plate after the printing;
   a pair of clamp members that clamp the substrate in a second direction perpendicular to the first direction, and support the lower surface of the mask plate facing to outer sides of the substrate in the second direction when the substrate is separated from the lower surface of the mask plate; and
   a pair of mask bend preventing members that support the lower surface of the mask plate facing to outer sides of the substrate in the first direction when the substrate is separated from the lower surface of the mask plate.

4. A screen printing apparatus according to claim 3, wherein the positioning portion supports the substrate in a manner sucking the substrate.

5. A screen printing apparatus according to claim 3, wherein
   the positioning portion includes two conveying rails provided in the first direction,
   the pair of clamp members are coupled with the conveying rails and the pair of mask bend preventing members are coupled with the conveying rails, respectively, and
   the conveying rails are moved so as to bring the pair of clamp members and the pair of mask bend preventing members in contact with the lower surface of the mask plate facing to the outer sides of the substrate.

6. A screen printing apparatus according to claim 5, wherein the pair of mask bend preventing members are so mounted that height of upper surfaces of the pair of mask bend preventing members, contacting with the lower surface of the mask plate, matches that of upper surfaces of the pair of clamp members, contacting with the lower surface of the mask plate.

7. A screen printing apparatus according to claim 3, wherein
   the pair of mask bend preventing members are vertically movably provided integrally with the positioning portion, and
   the apparatus further comprises a pair of maintaining members that maintain height of upper surfaces of the pair of mask bend preventing members same as that of the upper surfaces of the pair of clamp members when the substrate starts to be separated from the mask plate.

8. A screen printing apparatus according to claim 7, wherein the pair of maintaining members maintain height of upper surfaces of the pair of mask bend preventing members same as that of upper surfaces of the pair of clamp members during the substrate is separated from the mask plate.

9. A screen printing apparatus according to claim 7, wherein the pair of maintaining members urge the pair of mask bend preventing members towards the mask plate, and define an upper limit position of the pair of mask bend preventing members.

* * * * *